United States Patent [19]

Kuroda

[11] Patent Number: 4,797,371

[45] Date of Patent: Jan. 10, 1989

[54] METHOD FOR FORMING AN IMPURITY REGION IN SEMICONDUCTOR DEVICES BY OUT-DIFFUSION

[75] Inventor: Fumihiko Kuroda, Kashiwa, Japan

[73] Assignee: Kabushiki Kaisha Toshiba, Kawasaki, Japan

[21] Appl. No.: 131,732

[22] Filed: Dec. 11, 1987

[30] Foreign Application Priority Data

Feb. 26, 1987 [JP] Japan .................................. 62-43567

[51] Int. Cl.[4] .................. H01L 21/383; H01L 21/425
[52] U.S. Cl. .................................... 437/2; 357/13;
    437/44; 437/154; 437/156; 437/904
[58] Field of Search .............. 437/154, 2, 156, 904,
    437/44, 141; 357/13

[56] References Cited

U.S. PATENT DOCUMENTS

| | | | |
|---|---|---|---|
| 3,573,113 | 3/1971 | Nannichi | 437/156 X |
| 3,717,516 | 2/1973 | Hatcher, Jr. et al. | 437/156 X |
| 3,764,415 | 10/1973 | Raabe et al. | 437/904 X |
| 3,765,961 | 10/1973 | Mar | 437/904 X |
| 3,832,246 | 8/1974 | Lynch | 437/904 X |
| 3,886,579 | 5/1975 | Ohuchi et al. | 437/904 X |
| 4,240,843 | 12/1980 | Cellar | 437/904 X |
| 4,578,128 | 3/1986 | Mundt et al. | 437/156 X |
| 4,642,878 | 2/1987 | Maeda | 437/156 X |
| 4,743,569 | 5/1988 | Plumton et al. | 437/22 X |

FOREIGN PATENT DOCUMENTS

| | | |
|---|---|---|
| 198786 | 10/1985 | Japan . |
| 198785 | 10/1985 | Japan . |
| 101084 | 5/1986 | Japan . |
| 101085 | 5/1986 | Japan . |

*Primary Examiner*—George T. Ozaki
*Attorney, Agent, or Firm*—Oblon, Fisher, Spivak, McClelland & Maier

[57] ABSTRACT

The invention discloses a method including the following processes (a) through (c) for forming impurity regions in a semiconductor device (a) a process that forms at least one second conductive type impurity-doped region by doping second conductive type impurity selectively to a predetermined region of a first conductive type semiconductor layer constituting a semiconductor substrate, (b) a process that forms on the surface of the semiconductor substrate a diffusion mask having a first opening for exposing at least one of the second conductive type impurity regions and having a second opening for exposing a part adjacent to at least one of the second conductive type impurity regions, (c) a process that forms the second conductive type impurity region and a low concentration second conductive type impurity region being in contact with the former by out-diffusing through the first opening the second conductive type impurity of the second conductive type impurity region and re-doping the out-diffused impurity through the second opening to the first conductive type semiconductor layer. According to the method, an impurity region having a high breakdown voltage is formed by simple processes to have a smooth lateral concentration profile by means of vaporization and re-diffusion of the impurity previously doped to a semiconductor layer.

20 Claims, 9 Drawing Sheets

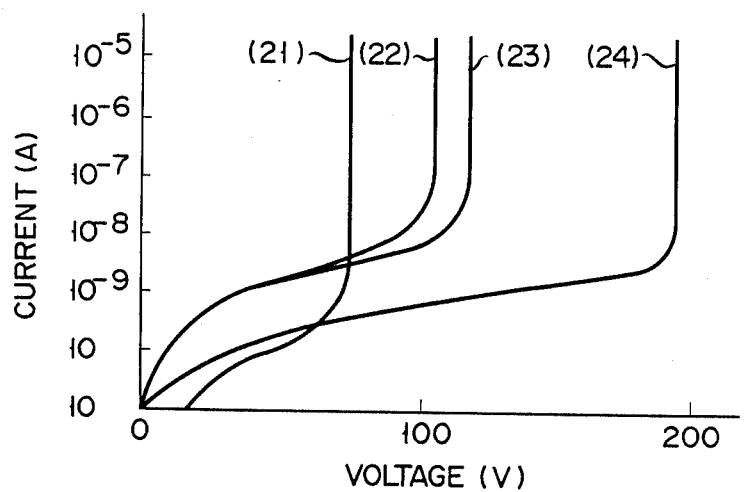
F I G. 3
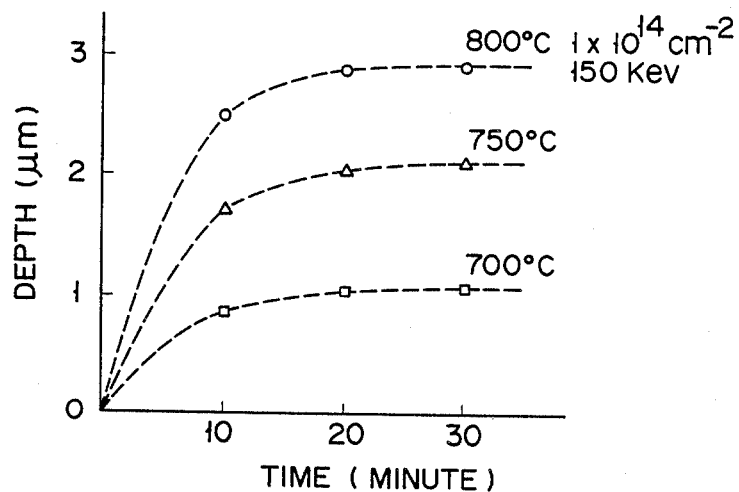
F I G. 5

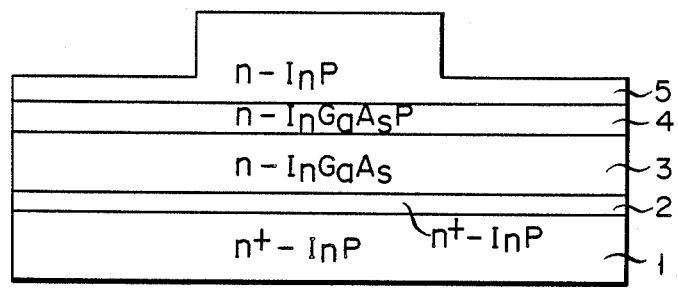
F I G. 6A
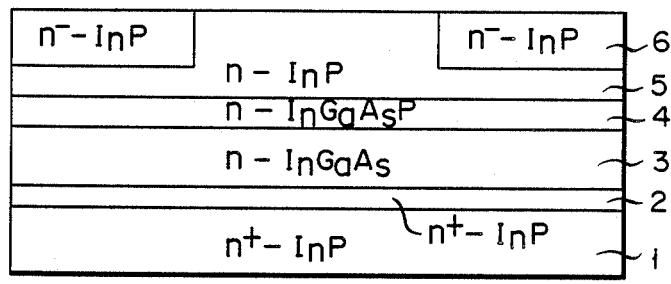
F I G. 6B
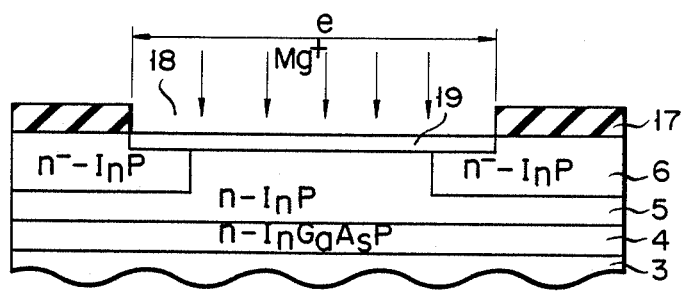
F I G. 6C

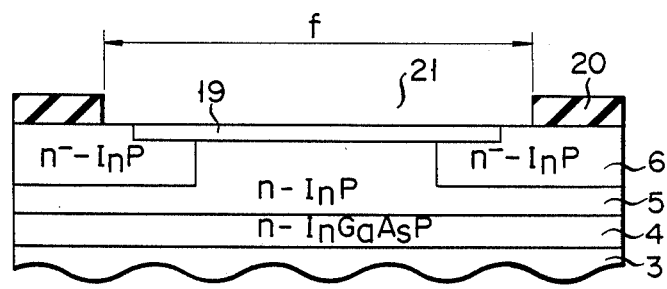
F I G. 6D
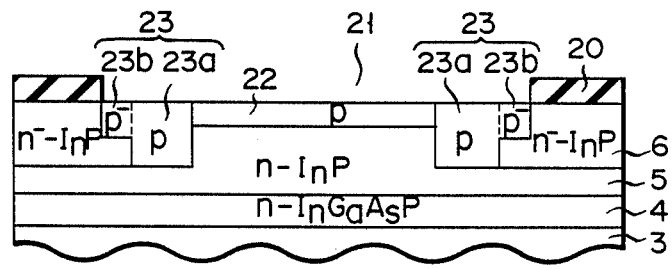
F I G. 6E
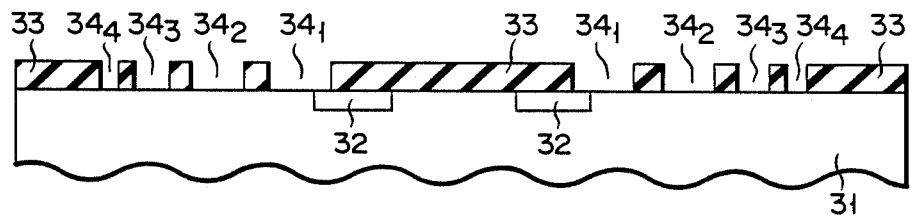
F I G. 7A
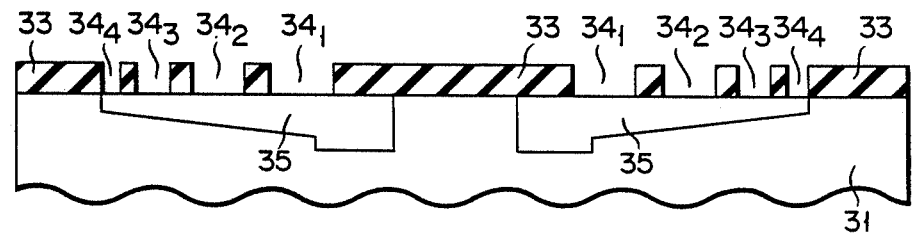
F I G. 7B

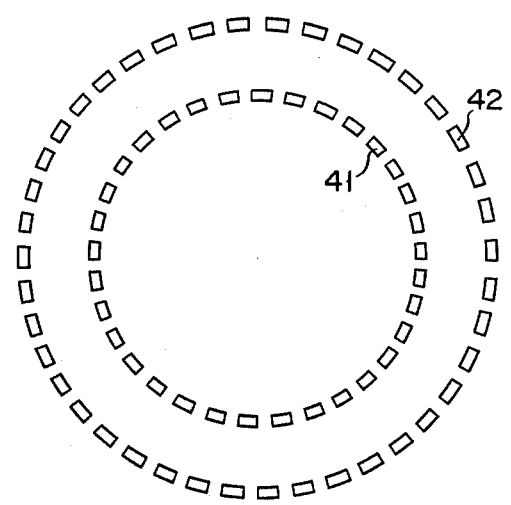
F I G. 8
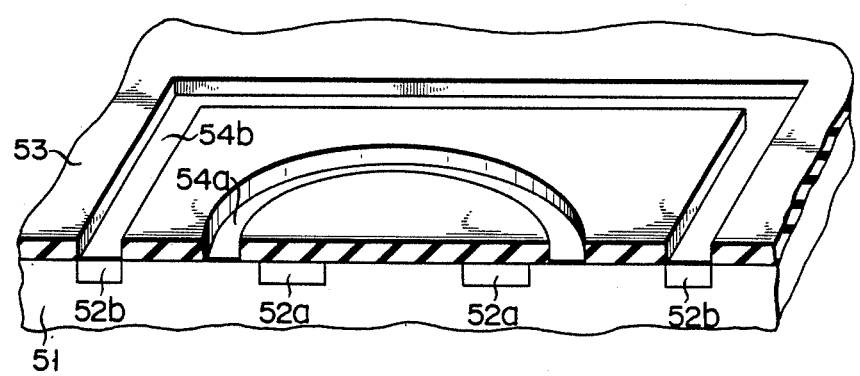
F I G. 9

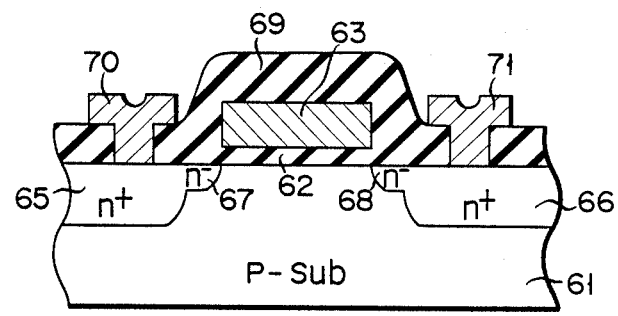
F I G. 10E
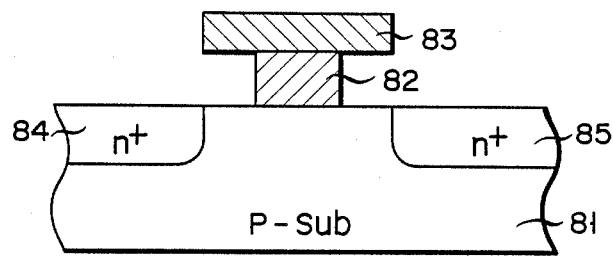
F I G. 11A
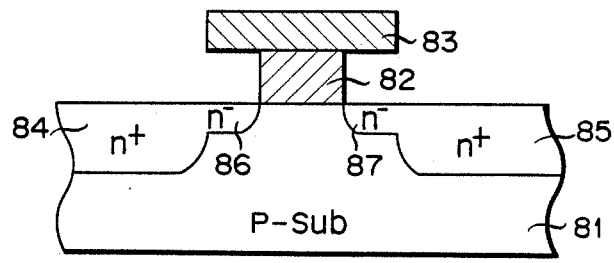
F I G. 11B

METHOD FOR FORMING AN IMPURITY REGION IN SEMICONDUCTOR DEVICES BY OUT-DIFFUSION

BACKGROUND OF THE INVENTION

1. Field of the Invention

The present invention relates to a method of manufacturing a semiconductor device, in particular, a method for forming an impurity region consisting of a high concentration part and an outer low concentration part for a semiconductor device.

2. Description of the Prior Art

In the prior art, semiconductor devices have been known, for example, MOS transistors of LDD-structure (Lightly Doped Drain-structure), which are characterized by impurity regions consisting of a high concentration part and an outer low concentration part and having a lateral concentration profile.

The impurity region having a lateral concentration profile has the main effect of raising the breakdown voltage of a PN junction. Therefore, the employment of such a lateral concentration profile is effective for the impurity region (called guard ring) formed for the purpose of raising the breakdown voltage of a planar junction. For example, a guard ring employed for an avalanche photo diode (APD) shall be described as follows.

FIG. 1 shows a section of the structure of an APD formed with a guard ring. Reference numeral 1 indicates an N+ type InP substrate, on which the following are laminated in order: buffer layer 2 of N− type InP, optical absorption layer 3 of N type InGaAs, buffer layer 4 of N type InGaAsP, multiplication layer 5 of N type InP and N− type InP layer 6, which is formed with P+ type main impurity region 13 to form a PN junction of the diode between the P+ type region and the N− type InP layer 6. Also, P type guard ring 12 is formed around and in contact with P+ type main impurity region 13. Further, the PN junction of the main impurity region is formed as a planar type, since a mesa type having a large exposed part in the junction results in deterioration of the junction, leading to lower reliability.

The APD as dsecribed above operates as follows. When light enters the photo detecting part of the PN junction under the condition of applying a high reverse bias near the breakdown voltage, light absorption by optical absorption layer 3 causes the production of carriers (electron-hole pairs). Optical absorption layer 3 is arranged to have a small band gap so as to absorb light of long wave length. One component (hole) of the resultant carriers in optical absorption layer 3 is accelerated toward the PN junction by the electric field of high intensity applied thereto and passes through carrier multiplication layer 4 thereby receiving avalanche-multiplication. The carriers multiplied as such are passed through the PN junction which is broken-down, and are drawn out of electrodes 15 and 16.

Guard ring 12 is formed for the following reasons. A planar type PN junction, although possessing various advantages, poses a problem called "edge breakdown". That is, the junction interface of a corner of the impurity region in its construction forms a curvature with a small radius of curvature to concentrate the electric field in the curvature, such that the curvature breaks down prior to the breakdown of other parts. The APD in FIG. 1 is so arranged that P type guard ring 12 which has higher breakdown voltage covers the corner of the P+ type main impurity region to prevent edge breakdown.

For the full function of preventing said edge breakdown, guard ring 12 should preferably have a deep and smooth concentration profile of impurity, in contrast to the abrupt junction of main impurity region 13, which further enhances the difference of the breakdown voltages between guard ring 12 and main impurity region 13. To form a guard ring having such a preferred profile, for example, as in the case of an APD employing a compound semiconductor of a III-V group represented by an InGaAs/InP system, Be ion implantation is used to form P type guard ring 12, whereas Cd is used as an impurity for forming P+ type main impurity region 13. The ion implanted Be has a deep diffusion depth that enables the guard ring to obtain the preferred profile.

However, to further enhance the function, guard ring 12 is required to have a concentration profile not only for the depth direction but also for the lateral direction. For example, as shown in FIG. 1, guard ring 12 is designed to comprise P type region 12a and outer P− type region 12b to further enhance the breakdown voltage of the guard ring. Yet, even with the Be ion implantation that obtains the preferred depth-oriented profile, the lateral diffusion length of Be is not so great that a preferred smooth concentration profile can not be obtained.

Therefore, to obtain a guard ring having a preferred lateral concentration profile, the following methods have been proposed in the prior art.

The first method was to employ different ion implantation conditions respectively for P type region 12a and the P− type region 12b of the guard ring (Japanese Patent Application Disclosure No. 60-198786 and No. 61-101084). According to this method, however, ion implantation must be performed twice to form guard ring 12, with the disadvantage of complicating the process of manufacture. In addition, ion implantations can often cause imperfections in the crystal lattice of the substrate such that a great number of ion implantations will cause a decrease of the breakdown voltage or an increase of the leak current.

The second method proposed was to make etching deeper than the peak depth of the impurity on the surface around the ion implanted region to form a low concentration part of the guard ring (refer to Japanese Patent Application Disclosure No. 60-198785). This method also has a disadvantage of complicating the process that much more, due to the extensive etching and further forming steps on the guard ring surface.

The third method proposed was to have an insulation film of a predetermined thickness distribution for a mask in the course of ion implantation for forming guard ring 12 (Japanese Patent Appl. Disclosure. No. 61-101085). In this method, the control for accurate thickness distribution of the insulation film for mask becomes difficult and also the process becomes complicated, with disadvantage of reducing the yield rate or resulting in high manufacturing costs.

SUMMARY OF THE INVENTION

The first object of the present invention is to provide a method for forming, through simple steps, the impurity region having a lateral concentration profile useful for the guard ring or LDD-structure transistor.

The second object of the invention is to provide a method for forming, through simple steps, a guard ring of a high breakdown voltage having a lateral concentration profile, and manufacturing an APD having a high reliability and a high reproducibility.

The first object of the invention will be achieved by the method comprising the following steps (a)-(c) for forming the impurity region in a semiconductor device.

(a) A step that selectively dopes a second conductive impurity in a predetermined region of a first conductive semiconductor layer constituting a semiconductor substrate to form at least one second conductive impurity doped region.

(b) A step that forms on the surface of said semiconductor substrate a diffusion mask having a first window for exposing at least one of the second impurity-doped regions and having a second window for exposing the part adjacent to at least one of the second conductive impurity doped regions.

(c) A step that, by means of heat treatment, causes the second conductive impurity in the second conductive impurity doped region to outdiffuse into the atmosphere through the first window and to dope through the second window in the first conductive semiconductor layer, thereby forming a second conductive impurity doped region of low concentration being in contact with the second conductive impurity region.

The second object of the invention will be achieved by the method of the following steps for manufacturing avalanche photo diodes (APD).

(a) A step that selectively dopes the second conductive impurity in the predetermined area for forming the guard ring in a first conductive semiconductor substrate for the APD thereby forming the impurity doped region.

(b) A step that forms on the surface of the first conductive semiconductor substrate for the APD a mask having windows for exposing at least a part of the impurity doped region and a predetermined region adjacent to the former.

(c) A step that, by means of heat treatment, causes the second conductive impurity in the impurity-doped region to outdiffuse into the atmosphere through the window and to dope through the other window in the first conductive semiconductor substrate, thereby forming a guard ring consisting of a second conductive impurity doped region of low concentration and the impurity doped region, those are in contact with each other.

The invention is based on the following new discoveries.

The present inventors previously disclosed that the employment of Mg as an impurity for forming the guard ring in an APD of InGaAs/InP system has been found to be effective in obtaining a desirable depth-oriented concentration profile (Ref. Japanese Patent Appln. Disclosure No. 60-210419 and No. 60-271568). However, according to further research, it was found that capless anneal after Mg ion implantation causes ion implanted Mg to outdiffuse from the substrate into the atmosphere and then to re-diffuse into the substrate. This is because of the very high vapor pressure of Mg. For example, the vapor pressure of Mg at 1000K (727° C.) is 12 Torr, while that of Be is a mere $10^{-7}$ Torr (Ref. Honig et al, "VAPOR PRESSURE DATA FOR THE SOLID AND LIQUID ELEMENTS", RCA REVIEW, June 1969). Therefore, the substrate was given Mg ion implantation, then was coated with an insulation film having windows and was given annealing treatment, and as a result, it was found that Mg out-diffuses through the window and then rediffuses only into the region having the window (the process is called window anneal). Further, it was found that the phenomenon of the foregoing was more remarkable if the Mg dosage exceeded $5 \times 10^{13}/cm^2$.

BRIEF DESCRIPTION OF THE DRAWINGS

FIG. 3 shows a graph comparing the breakdown voltage of the guard ring in an APD manufactured by the method shown in FIGS. 2A through 2E and the breakdown voltage of the guard ring in an APD manufactured by the conventional method;

FIG. 5 shows the relation between the condition of capless anneal and the junction depth formed by the rediffusion of an impurity;

FIGS. 6A through 6E show sections illustrating in order the process steps of another preferred embodiment of the manufacturing method of an APD according to the invention;

FIGS. 7A and 7B show sections illustrating the processes for forming a guard ring in still another embodiment of the manufacturing method of an APD according to the invention;

FIG. 8 and FIG. 9 show top views of modifications of the window pattern in the mask for re-diffusion;

FIGS. 10A through 10E show sections illustrating the manufacturing processes in a preferred embodiment applying the invention to the manufacture of a MOSFET of LDD construction; and FIGS. 11A and 11B show sections illustrating the manufacturing processes in a preferred embodiment applying the invention to the manufacture of a MESFET of LDD construction.

DETAILED DESCRIPTION OF THE PREFERRED EMBODIMENT

Preferred Embodiment 1

Figure 1:
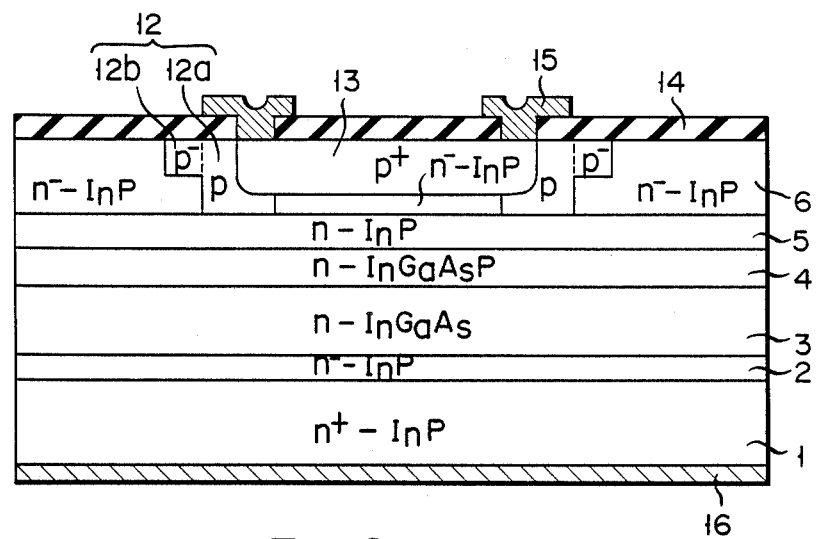
FIG. 1 shows a section of a conventional APD having a guard ring for the main junction.

FIGS. 2A through 2E illustrate manufacturing processes in a preferred embodiment of an APD of the InGaAs/InP system according to the invention. In the drawings, reference numerals respectively indicate the same parts as those in FIG. 1.

Figure 2A:
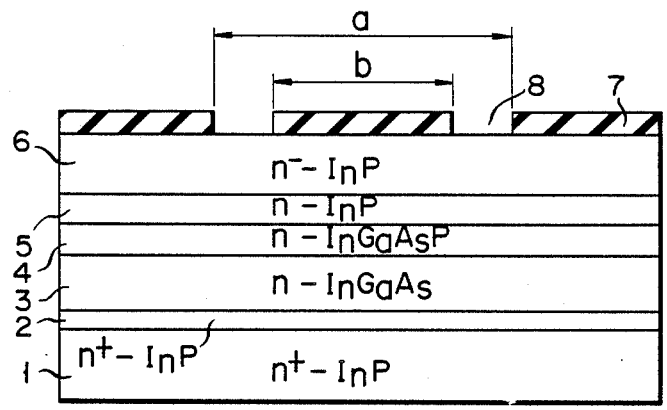
FIGS. 2A through 2E show sections illustrating in order the process steps of an embodiment of the manufacturing method of an APD according to the invention.

In the embodiment, as shown in FIG. 2A, the surface of an epitaxial wafer for an APD is coated with a predetermined thickness insulation film 7, which has a ring-shaped opening (ion implantation window) 8, to form a first blocking mask covering the epitaxial wafer surface. The outer diameter a and the inner diameter b of the ring-shaped opening 8 are determined so as to expose the main junction of the final forming to be exposed in the opening 8. That is, assuming the radius of the ring-shaped P+ type impurity region 13 is r, they are determined to meet $b < r < a$ relation. In this embodiment, they may be $a = 120 \ \mu m$ and $b = 70 \ \mu m$.

Figure 2B:
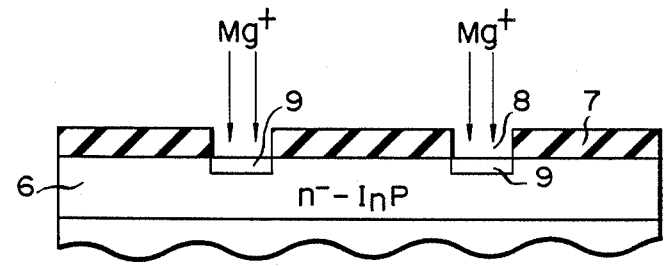

The epitaxial wafer of the foregoing can be obtained by making sequential epitaxial growths in layers on an N+ type InP substrate 1 in the order of N+ type InP buffer layer 2, N type InGaAs optical absorption layer 3, N type InGaAsP buffer layer 4, N type InP carrier multiplication layer 5 and N⁻ type InP layer 6. Buffer layer 2 is interposed to ease stress in the direct heterojunction of the upper and lower layers, and buffer layer 4 is interposed to ease the pile-up of charge by the band step between InGaAs layer 3 and InP layer 5. Examples of impurity concentration and thickness for respective layers are shown as follows:

InGaAs absorption layer 3
$5 \times 10^{15}/cm^3$, 3 μm;
InGaAsP buffer layer 4
$1 \times 10^{16}/cm^3$, 0.5 μm;
InP carrier multiplication layer 5
$2 \times 10^{16}/cm^3$, 0.8 μm;
N type InP layer 6
$5 \times 10^{15}/cm^3$, 3 μm; and
insulation film 7;
CVD-SiO₂ film over thickness 0.5 μm Further, as shown in FIG. 2B, through the mask of insulation film 7, ion implantation of Mg, which is a P type impurity, is carried out to form Mg ion-doped region 9 that becomes P type part 12a of guard ring 12. As an example, for the condition of the ion implantation, the acceleration voltage is 150 KeV and dosage is $1 \times 10^{14}/cm^2$.

An ion beam drawing method may also be employed to selectively perform Mg ion implantation in a predetermined region without the use of a first mask to form the Mg ion-doped region 9.

Figure 2C:
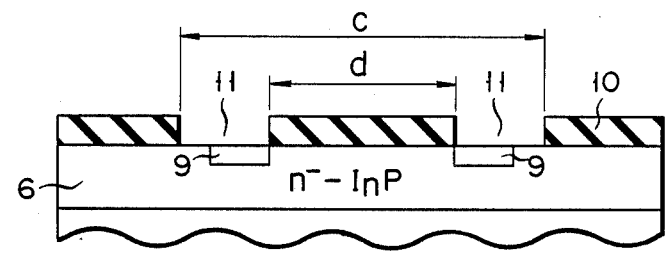

Next, insulation film 7 for the first mask is removed, and a new insulation film 10 (second mask) having a ring-shaped window 11 is formed as shown in FIG. 2C. Window 11 incorporates the first window, exposing the Mg ion-doped region, and the second window, exposing the part adjacent to the first window, into one opening. The inner diameter d and the outer diameter c of the ring-shaped window 11 are determined to meet $b \leq d < a < c$ in relation to the outer diameter a and the outer diameter b of window 8 in the first mask. Thus, at least a part of Mg ion-doped region 9 as well as part of N⁻ type InP layer 6 on the outer side of the region 9 is exposed. In practice, d=b and c should be larger than a by 2-5 μm. Further, taking into account a subsequent heat treatment, insulation film 10 is preferred to be of PSG (phospho-silicate glass film) with a thickness greater than 0.3 μm, with regard to the difference of the thermal expansion coefficient between the film and the wafer.

Next, heat treatment (window anneal) is carried out with the exposure of InP layer 6 in window 11, as shown in FIG. 2C. The heat treatment is conducted for 20 minutes at 750° C. in an atmosphere of hydrogen and introduces 6000 pm of PH₃ into the atmosphere to prevent vaporization of P from the InP layer. The introduction of PH₃ achieves an equilibrium between respective vapor pressures of the InP layer and the atmosphere and prevents vaporization of P from InP. The window anneal activates Mg in Mg ion-doped layer 9 to form P type region 12a of the guard ring. Simultaneously, because of the relatively high vapor pressure of Mg, a part of the Mg in ion-doped layer 9 outdiffuses into the atmosphere through window 11 and then re-diffuses into the wafer again through window 11. This re-diffusion forms P⁻ type region 12b of the guard ring (shown in FIG. 2D). As a result, guard ring 12 is formed, having a deep PN junction in the area of ion implantation, a shallow PN junction at the outside of the former, and a lateral concentration profile.

Then, following the usual processes, thermal diffusion of Cd that is P type impurity forms P⁺ type main diffusion layer 13 constituting a photo detecting part and a passivation film 14 is formed. Further, a contact hole is provided in passivation film 14 to form electrode 15 for the P-type layer by means of evaporation and patterning of electrode metal. Also, the electrode metal is evaporated onto the rear surface of the wafer to form electrode 16 for an N-type layer and obtain an APD of the construction shown in FIG. 2E. Guard ring 12, P⁺ type main diffusion layer 13 and P type electrode 15 are not necessarily in alignment with one another in formation.

To evaluate the effect of the guard ring in an APD obtained by means of the foregoing embodiment, a light receptor and a guard ring were separately formed and their reverse current-voltage characteristics were measured. Finding the same characteristics of the guard ring in an APD obtained by a conventional method, comparison was made with one another to find the superiority of the method for forming a guard ring according to the invention. The result is shown in FIG. 3. Curve 21 shows the characteristics of the diode obtained by mesa etching after forming an abrupt junction by means of thermal diffusion of Cd, and may be considered as a reference characteristic of the light receptor. Curve 24 indicates the characteristics of the diode having an Mg-only junction formed in the same manner of the foregoing embodiment, and may be considered as a reference characteristic of the guard ring in the case of an APD formed according to the foregoing embodiment. Curves 22 and 23 are examples for comparison and respectively represent the structures that employ Be and Mg for the impurity of guard rings which are formed not to have a lateral concentration profile by means of one-shot ion implantation and cap anneal. Dosages of ion implantation are $1 \times 10^{13}/cm^2$ for Be of curve 22 and $1 \times 10^{14}/cm^2$ for Mg of curve 23 and the heat treatment for either case is 20 minutes at 750° C. Junctions for curves 21 through 24 are each formed on an identical substrate.

As shown by the results in FIG. 3, the properties of junctions 22 and 23 forming guard ring 12 according to the conventional method showed gains of some tens of V in breakdown voltage difference from the reference characteristic of curve 21. In contrast, the guard ring of the APD of the foregoing embodiment shows a gain of over 100 V in breakdown voltage from the reference characteristic of curve 21. Besides, the dark current at the break-down voltage of the light receptor is kept low compared to the junction of the conventional method. Actually, the I-V property of the APD being provided with a light receptor and a guard ring formed according to the invention conformed to curve 21 in FIG. 3.

Figure 4A:
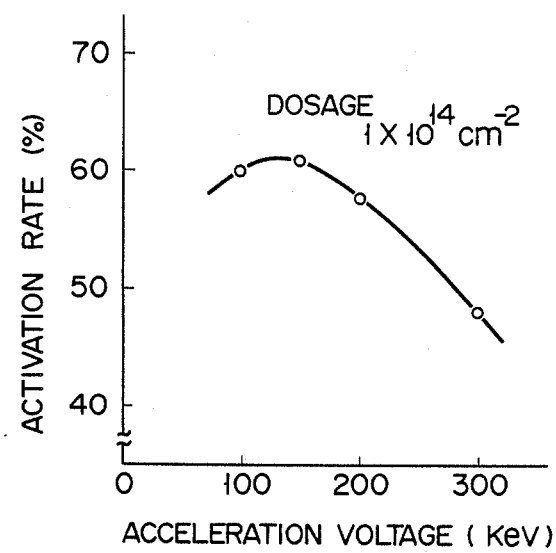
FIGS. 4A and 4B show relations between the condition for ion implantation and the activation rate of the impurity in the preferred embodiment shown in FIGS. 2A through 2E.
Figure 4B:
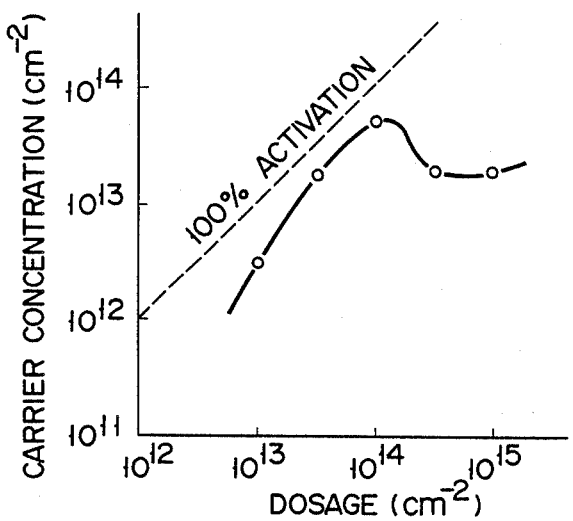

Also, with the foregoing embodiment, a study of the relation of the condition of the Mg-ion implantation to the activation rate of the ion-implanted Mg has determined the results shown in FIGS. 4A and 4B. As shown in FIG. 4A, the activation rate of Mg shows large values in the range of 100-200 KeV of acceleration voltage. Also, as shown in FIG. 4B, the activation rate drops sharply as the dosage exceeds $1 \times 10^{14}/cm^2$. From the results, the proper condition for Mg-ion implantation in FIG. 2B is found to be in the range of acceleration voltage 100-300 KeV and dosage $5 \times ^{13}/cm^2 - 1 \times 10^{14}/cm^2$.

Figure 2D:
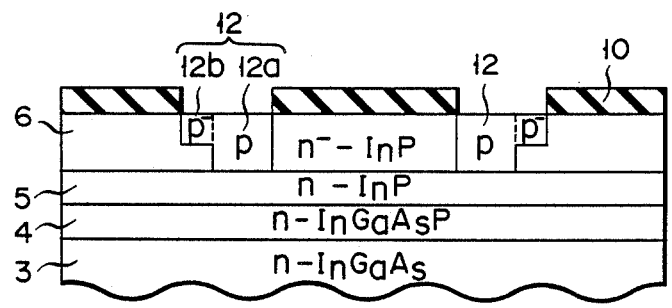
Figure 2E:
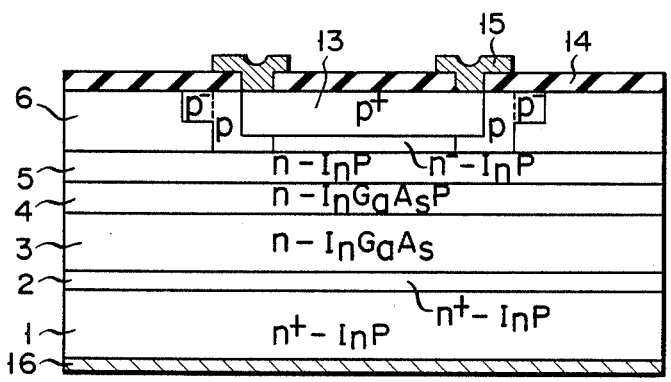

Furthermore, the relation between the condition of heat treatment in the window anneal process (FIG. 2D)

of the foregoing embodiment and the depth of the PN junction formed by Mg re-diffusion was sought with regard to temperatures of heat treatment to find a relation between the heat treatment time and the diffusion depth, as in FIG. 5. It is noted that conditions of ion implantations being carried out prior to window annealing are the same for each case, namely, 50 KeV for acceleration voltage and $1 \times 10^{14}/cm^2$ for dosage. From these results, it was found that heat treatment of over ten minutes at 750° C. started to form a deep layer of diffusion and saturated to the depth of about 2 $\mu$m in twenty minutes. Since the width of P− type part $12_b$ of a guard ring is desired to be about the same as or a bit larger than the diffusion depth, the desired width of P− type part $12_b$ is derived to be 214 5 m from the data. This is represented by the following relation between the respective outer diameters a and c of windows 8 and 11 of the afore-stated two diffusion masks:

$$c - a = 2 \sim 5 \ \mu m$$

It was also found that as the temperature of window anneal exceeded 800° C., the wafer surface became very coarse, which causes a problem in practical use.

According to the embodiment shown in FIGS. 2A–2E, a guard ring having a lateral concentration profile may be formed by a simple method, taking advantage of the high vapor pressure property of Mg employed as an impurity for forming a P type guard rng, and the function for raising the breakdown voltage of the guard ring may be greatly enhanced.

Preferred Embodiment 2

FIGS. 6A–6D show a manufacturing process of another embodiment applying the invention to the manufacture of the APD of InGaAs/InP system. In the drawings, the same reference numerals indicate the same parts as those in FIGS. 2A–2E.

According to this embodiment, the manufacturing process of a wafer is different from that of embodiment 1. That is, after forming epitaxial growths on N+ type InP substrate 1 in order from N+ type InP buffer layer 2 through N type carrier multiplication layer 5, the epitaxial growth of N− type InP layer 6 is not immediately made for the top layer, but instead, excluding a region which is to become a photo detecting area in the N type InP carrier multiplication layer 5, the rest of layer 5 is removed by etching up to a certain depth, as shown in FIG. 6A. Then, the etched area is filled in to form N− type InP layer 6, as shown in FIG. 6B.

Further, as shown in FIG. 6C, insulation film 17 is coated to form a mask having circular window 18. Insulation film 17 is made of CVD-SiO$_2$ film, as in embodiment 1. The diameter e of window 18 is so determined as to expose the surface of the wafer in an area larger than the part for forming the main junction. Mg-ion implantation is made to wafer through window 18 to form Mg-ion doped layer 19.

With insulation film 17 removed, a new insulation film 20 is deposited, as shown in FIG. 6D, and is provided with circular window 21 to form a second mask. The diameter f of window 21 is determined to be larger than the diameter e of window 18 of the first mask. Insulation film 20 is made of PSG film in consideration of the subsequent window anneal as in the embodiment 1.

With the state in FIG. 6D, window anneal is carried out under the same heat treatment condition as in embodiment 1. Upon activation of Mg in Mg-ion doped layer 19 from the window anneal, P type impurity region 22, to be an abrupt junction, is formed in N type InP layer 5 and P type part 23a of the guard ring, to be a graded junction, is formed in N− type InP layer 6 around region 22. The reason for forming the P type diffuion layer constituting the abrupt junction at N type InP layer 5, despite the activation of Mg, lies in the high impurity concentration in N type InP layer 5. With the activation, part of the Mg outdiffuses into the atmosphere and then re-diffuses into the wafer. This re-diffusion forms P− type part 23b of the guard ring As shown above, according to the embodiment, the one-shot Mg doping process of ion implantation can simultaneously form the main impurity region 22 for the abrupt junction and guard ring 23 consisting of guarded junction part 23a and low concentration 23b. The APD thus obtained possesses a good breakdown voltage property, as in embodiment 1, because of the guard ring construction similar to that of embodiment 1.

Preferred Embodiment 3

FIGS. 7A and 7B show an embodiment for forming a guard ring having the radius of moderate curvature in a lateral junction profile.

In the embodiment shown in FIG. 7A, an Mg-ion doped region 32 is formed on wafer of InP series 31 for an APD by means of a first mask, and then insulation film 33 is formed for a second mask. Insulation film 33 (made of PSG film for the same reason as in embodiment 1) is provided with a plurality of concentric ring-shaped windows $34_1$–$34_4$. However, the breadth of each concentric window becomes smaller the further it is from the center.

With the state of FIG. 7A, window anneal is carried out that activates Mg in Mg-ion doped region 32 and a part of Mg outdiffuses into the atmosphere through window 341 and then re-diffuses in wafer 31 through windows $34_1$–$34_4$. However, the amount of re-diffusing Mg for each of the windows becomes smaller going toward the outer region. Therefore, guard ring 35 is provided, having a shallower junction toward the outer side, as shown in FIG. 7B.

Even with a same breadth for each of ring-shape windows $34_1$–$34_4$, the same result is obtained as in the foregoing. This is because the amount of rediffusion decreases due to the shortflying path of the out-diffused Mg to the windows further away from the ion-doped layer 32.

Preferred Embodiment 4

FIG. 8 and FIG. 9 each show modifications for embodiments 1 and 3, respectively.

The window in the second mask may not be of a perfect ring shape. That is, as shown in FIG. 8, the window may be of an aggregate of a number of smaller windows $41s$ and $42s$ arranged with a spacing in a circle.

Further, in the case of forming the Mg vapor source on a separate position in the wafer, the second mask may be formed so as to completely cover the Mg-ion doped region constituting part of the guard ring. In this case, the condition d<a of the foregoing is not necessary.

For example, as in FIG. 9, in Mg-ion implantation on wafer 51 for an APD of InP series by means of the first mask (not shown), ion-doped layer 52b which acts only as a diffusion source of Mg, as well as ion-doped layer 52a for a part of the guard ring, is also formed. The two ion-doped layers 52a and 52b are formed to be concentric, as shown. Then, the second mask of insulation film 53 is formed which is provided with an opening 54a just outside the inner ion-doped layer 52a and another opening 54b almost corresponding to the outer ion-doped layer 52b. As shown in the figure, the ion-doped layer 52a shall not be the vapor source of Mg due to its complete covering by insulation film 53.

Upon window-annealing with the state in FIG. 9, Mg out-diffuses from ion doped region 52b through window 54b and re-diffuses through window 54a to the wafer. Therefore, a guard ring consisting of this re-diffusion part and the activated part of ion-doped region 52a is formed to obtain a high breakdown voltage, as in embodiment 1. Furthermore, the ion-doped region 52b may be used as a resistance element.

Although embodiments 1 through 4 concern the formation of a guard ring by Mg in InGaAs/InP type APD, the invention is also effective even for the combination of a semiconductor material other than the foregoing material and an impurity. For example, employing as a substrate GaAs, GaSb, ZnS, ZnSe, InGaAs or InGaAsP and as an impurity Zn, Yb, Cd, S, Te or Se respectively having a high vapor pressure like Mg, the impurity region of the guard ring may be formed in the same manner as the foregoing embodiments. In the compound semiconductor of II-III group, the invention may be effectively applied to the case of employing Na as the impurity for the guard ring.

Furthermore, although the foregoing embodiments employed an insulation film as mask in forming the guard ring, masks of another material, such as a metal mask, may also be employed.

The following embodiments 5 and 6 are suited to forming the diffusion layer constituting the main junction of semiconductor element but not to the forming of a guard ring which is an auxiliary diffusion layer.

Preferred Embodiment 5

FIGS. 10A–10E show embodiments of the invention applied to the manufacture of a MOS-FET of LDD-structure.

Figure 10A:
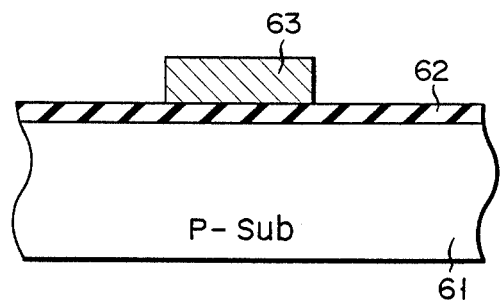
Figure 10B:
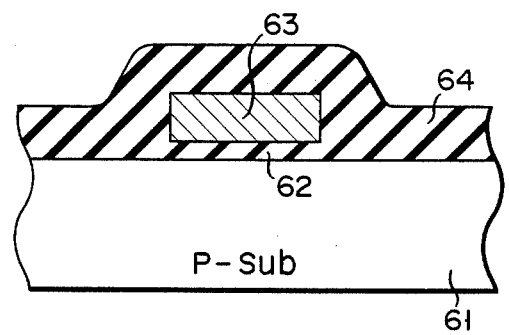

First, as shown in FIG. 10A, on the surface of a P type substrate 61 is formed a gate 63 interposed by gate insulation film 62, and then a CVD insulation film 64 is laminated to cover the whole face, as shown in FIG. 10B.

Figure 10C:
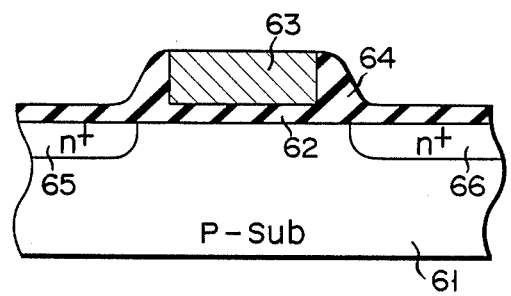

Next, anisotropic etching is performed on CVD insulation film 64 by means of reactive etching to keep the CVD film only on the side walls of gate 63, as shown in FIG. 10c. In this state, ion implantation of N+ type impurity forms N+ type regions 65 and 66 on P type substrate 61, as shown in FIG. 10C. However, since the ion implantation is blocked by CVD insulation film 64 remaining on the side walls of gate 63, N+ type regions 65 and 66 are not aligned to gate 63 as in the Figure.

Figure 10D:
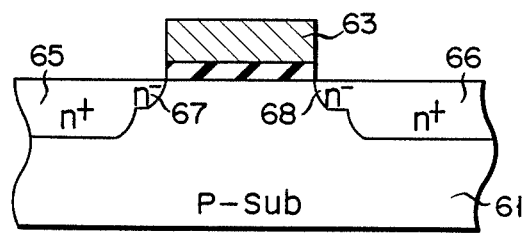

Further, insulation films 62 and 64 are removed by etching to expose the surface of substrate 61 as shown in FIG. 10D and capless annealing is performed. The heat treatment out-diffuses N+ type impuriy from N+ type regions 65 and 66 into the atmosphere and then rediffuses it from the atmosphere to substrate 61. The rediffusion forms N− type regions 67 and 68 of small depth of diffusion on the inner side of N+ type regions 65 and 66 and obtains an LDD structure.

Next, the whole surfae is covered with CVD insulation film 69, as shown in FIG. 10E. Then, opening contact holes, source electrode 70 and drain electrode 71 are formed by evaporation and patterning of electrode metal to complete the MOS-FET of the LDD structure. Preferred Embodiment 6.

FIGS. 11A and 11B show embodiments of the invention applied to the manufacture of a MES-FET of an LDD structure.

According to the embodiments, as shown in FIG. 11A, gate electrodes 82 and 83 of lamination structure are formed on a P type substrate 81. With substrate 81 being of InP or GaAs, materials such as WNx for lower gate 82 are used to form a Schottky barrier as an intermediary to the substrate 81. For upper gate 83, metal materials different from those of gate 82 should be used. Particularly, the material should be able to obtain sufficient selectivity of etching in relation to lower gate 82. Also, in patterning lower gate 82 using upper gate 83 as a mask, sufficient over-etching forms an overhang status, as shown. In this state, ion implantation of N type impurity to P type substrate 81 by using gate 83 as mask forms N+ type regions 84 and 85, not aligned with lower gate 82, as shown.

Further, capless annealing in the state of FIG. 11A out-diffuses the impurity of N+ type regions 84 and 85 and re-diffuses the out-diffused impurity. As a result of this re-diffusion performed using lower gate 82 as mask, N− type regions 86 and 87 are formed self-aligned to lower gate 82, as shown in FIG. 11B, to complete the MES-FET of the LDD structure.

Even in this embodiment, N− type layers 86 and 87 adjacent to the channel region may be formed without any direct ion implatation. In addition, since ion implantation uses upper electrode 83 for a mask, while re-diffusion of capless annealing uses lower electrode 82 for a mask, that change of mask pattern is not necessary throughout the processes. Thus, an advantage results, in that the processes may be greatly simplified.

What is claimed is:

1. A method for forming an impurity region in a semiconductor device, in particular, a method including the following processes (a) through (c),
   (a) a process that forms at least one second conductive type impurity doped region by means of doping second conductive type impurity selectively to a predetermined region of a first conductive type semiconductor layer constituting a semiconductor substrate;
   (b) a process that forms on the surface of said semiconductor substrate a diffusion mask having a first opening for exposing at least one of said second conductive type impurity regions and having second opening for exposing a part at least one of said first conductive type semiconductor layer; and
   (c) a process that forms a low concentration second conductive type impurity region by out-diffusing through said first opening the second coductive type impurity in said second conductive type impurity region and doping the out-diffused impurity through said second opening to said first conductive type semiconductor layer, by means of heat treating.

2. A method according to claim 1, wherein said first opening and second opening constitute one opening.

3. A method according to claim 2, wherein ion implantation is employed for doping a second conductive type impurity selectively to the predetermined region of said first conductive type semiconductor layer.

4. A method according to claim 2, wherein for doping said second conductive type impurity selectively to a predetermined region of said first conductive type semiconductor layer, a mask having an opening in said predetermined region is employed.

5. A method according to claim 4, wherein said mask consists of phospho-silicate glass.

6. A method according to claim 2, wherein said second conductive type impurity doped region and a low concentration second conductive type impurity doped region being in contact with the former are an auxiliary diffusion layer to be a guard ring of the main junction constituting the main junction of the semiconductor element.

7. A method according to claim 6, wherein said main impurity region is formed after the forming of said auxiliary diffusion layer.

8. A method according to claim 2, wherein said second conductive type impurity doped region and a low concentration second conductive type impurity doped region being in contact with the former are the main impurity region constituting the main junction of the semiconductor element.

9. A method according to claim 2, wherein said second conductive type impurity doped region and a low concentration second conductive type impurity doped region being in contact with the former are a source region and/or drain region in an FET of an LDD structure.

10. A method according to claim 1, wherein said second conductive type impurity doped region exposed to said first opening is provided not as the intended impurity region, but as the vapor source of the second conductive type impurity.

11. A method of manufacturing an avalanche photo diode having a guard ring being in contact with a main impurity region constituting a planar type main junction which is a photo detecting part, and in particular, a method comprising,
(a) a process that forms an impurity doped region by selectively doping a second conductive type impurity on the predetermined part for said guard ring in a first conductive type semiconductor layer constituting a semiconductor substrate for an avalanche photo diode;
(b) a process that forms a diffusion mask having an opening exposing at least one of said impurity doped regions and a predetermined region being in contact with the outside of the former, on the surface of said semiconductor substrate for an avalanche photo diode; and
(c) a process that forms a low concentration second conductive type impurity doped region being in contact with the former by out-diffusing the second conductive type impurity in said impurity doped region through the opening of said diffusion mask and doping the out-diffused second conductive type impurity through said opening to said first conductive type semiconductor substrate, by means of heat treating.

12. A manufacturing method according to claim 11, wherein ion implantation is employed for the method of doping second conductive type impurity selectively to the predetermined part for forming said guard ring.

13. A manufacturing method according to claim 12, wherein for doping second conductive type impurity selectively to the predetermined region of said first conductive type semiconductor layer by means of ion implantation, a blocking mask having an opening in said predetermined region is employed.

14. A manufacturing method according to claim 13, wherein the outer and inner diameters a and b of the ring-shaped opening of said blocking mask, the outer and inner diameters c and d of the ring shape opening of said diffusion mask and radius r of said main impurity region satisfy the relation represented by $b \leq r < a$, and $b \leq d < a < c$.

15. A manufacturing method according to claim 13, wherein said first conductive semiconductor layer is a low concentration N type InP layer and the second conductive type impurity for forming said guard ring is Mg.

16. A manufacturing method according to claim 15, wherein the impurity concentration of said low concentration N type InP layer is $2 \times 10^{15}/cm^3 - 1 \times 10^{14}/cm^3$, conditions of Mg ion implantation are 100–300 KeV of acceleration voltage and $5 \times 10^{13}/cm^2 - 1 \times 10^{14}/cm^2$ of dosage.

17. A manufacturing method according to claim 15, wherein said main impurity region is formed by thermal diffusion of Cd to the region surrounded by said guard ring after forming the guard ring first.

18. A manufacturing method according to claim 11, wherein said diffusion mask is provided with a plurality of other ring-shaped openings concentrically surrounding said opening.

19. A manufacturing method according to claim 11, wherein said heat treatment is carried out in an atmosphere adjusted to prevent vaporization of elements constituting the semicoductor substrate for said avalanche photo diode.

20. A method of manufacturing an avalanche photo diode having a guard ring being in contact with the main impurity region constituting a planar type main junction which is a photo detecting part, and in particular, a method comprising,
(a) a process that forms impurity doped regions by doping a second conductive type impurity selectively to a predetermined part for forming said main impurity region and guard ring in the first conductive type semiconductor layer constituting a semiconductor substrate for an avalanche photo diode having a high concentration of impurity at the predetermined part for said main impurity region and a low concentration of impurity at the predetermined part for said guard ring;
(b) a process that forms on the surface of a first conductive type semiconductor substrate for an avalanche photo diode a diffusion mask having an opening exposing said impurity doped region and a predetermined region adjacent to the impurity doped region;
(c) a process that, by means of heat treating, diffuses a second conductive type impurity in said impurity doped region to said first conductive type semiconductor layer and forms a second conductive type main impurity region constituting an abrupt junction at said part of high concentration impurity and forms a second conductive type impurity region constituting a graded junction at the peripheral part of low concentration impurity; and
(d) a process that forms a guard ring consisting of a second conductive type impurity region constituting said graded junction and a low concentration second conductive type impurity doped region being in contact with the former, by out-diffusing the second conductive type impurity of said impurity doped region through the opening of said diffusion mask and doping the out-diffused impurity through the opening to said first conductive type semiconductor substrate, through means of said heat treating.

* * * * *